(12) United States Patent
McBride

(10) Patent No.: US 6,260,180 B1
(45) Date of Patent: Jul. 10, 2001

(54) SYSTEM AND METHOD FOR DETECTING FETS THAT ARE SUSCEPTIBLE TO BOOTSTRAPPING

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/311,255

(22) Filed: May 13, 1999

(51) Int. Cl.[7] .................................................. G06F 17/50
(52) U.S. Cl. .................... 716/5; 364/578; 438/10
(58) Field of Search ........................ 716/5; 364/489, 364/578; 438/10

(56) References Cited

U.S. PATENT DOCUMENTS

| | | | | |
|---|---|---|---|---|
| 4,907,180 | * | 3/1990 | Smith | 364/578 |
| 5,790,415 | * | 8/1998 | Pullela et al. | 364/489 |
| 5,880,967 | * | 3/1999 | Jyu et al. | 364/489 |
| 6,077,717 | * | 6/2000 | Mcbride | 438/10 |

* cited by examiner

Primary Examiner—David Nelms
Assistant Examiner—Thong Le

(57) ABSTRACT

The present invention is generally directed to a system and method for evaluating a netlist of a schematic to detect circuit configurations that are susceptible to bootstrapping. In accordance with one aspect of the present invention, a method is provided for detecting n-type field effect transistors (NFETs) that are susceptible to bootstrapping. The method operates by evaluating at least one NMET in a netlist and ensuring that the at least one NFET is not channel connected to ground. The method further ensures that a gate node of the at least one NFET is connected to a channel node of a PFET. In accordance with a similar aspect of the present invention, a method is provided for detecting p-type field effect transistors (PFETs) that are susceptible to bootstrapping. The method operates by evaluating at least one PFET in a netlist and ensuring that the at least one PFET is not channel connected to VDD. The method further ensures that a gate node of the at least one PFET is connected to a channel node of a NFET.

20 Claims, 11 Drawing Sheets

SYSTEM AND METHOD FOR DETECTING FETS THAT ARE SUSCEPTIBLE TO BOOTSTRAPPING

BACKGROUND OF THE INVENTION

1. Field of the Invention

The present invention generally relates to computer-aided circuit design systems, and more particularly to a system and method for evaluating a netlist file and detecting FETs that are susceptible to bootstrapping or charge pumping.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black boxes" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various circuit characteristics, attributes, or configurations that are not identified and/or addressed in the PathMill product and other similar products. For example, there is often a need to evaluate a circuit to detect a wide variety of potential design pitfalls. Certain pitfalls may apply to all designs, while certain other pitfalls may apply only to certain designs. One potential circuit pitfall relates to design configurations where bootstrapping, or charge pumping occurs. As is known, bootstrapping (or charge pumping) occurs when a node voltage exceeds VDD (the supply voltage). Although there are certain situations in which bootstrapping is desired, many times it can have undesirable consequences on circuit operation.

Therefore, it would be desirable to provided an automated tool that can evaluate a netlist file of a large circuit design to identify particular circuit configurations that may result in bootstrapping.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

The present invention is generally directed to a system and method for evaluating a netlist of a schematic to detect circuit configurations that are susceptible to bootstrapping. In accordance with one aspect of the present invention, a method is provided for detecting n-type field effect transistors (NFETS) that are susceptible to bootstrapping. The method operates by evaluating at least one NFET in a netlist and ensuring that the at least one NFET is not channel connected to ground. The method further ensures that a gate node of the at least one NFET is connected to a channel node of a PFET.

In accordance with a similar aspect of the present invention, a method is provided for detecting p-type field effect transistors (PEETs) that are susceptible to bootstrapping. The method operates by evaluating at least one PFET in a netlist and ensuring that the at least one PFET is not channel connected to VDD. The method further ensures that a gate node of the at least one PFET is connected to a channel node of a NFET.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
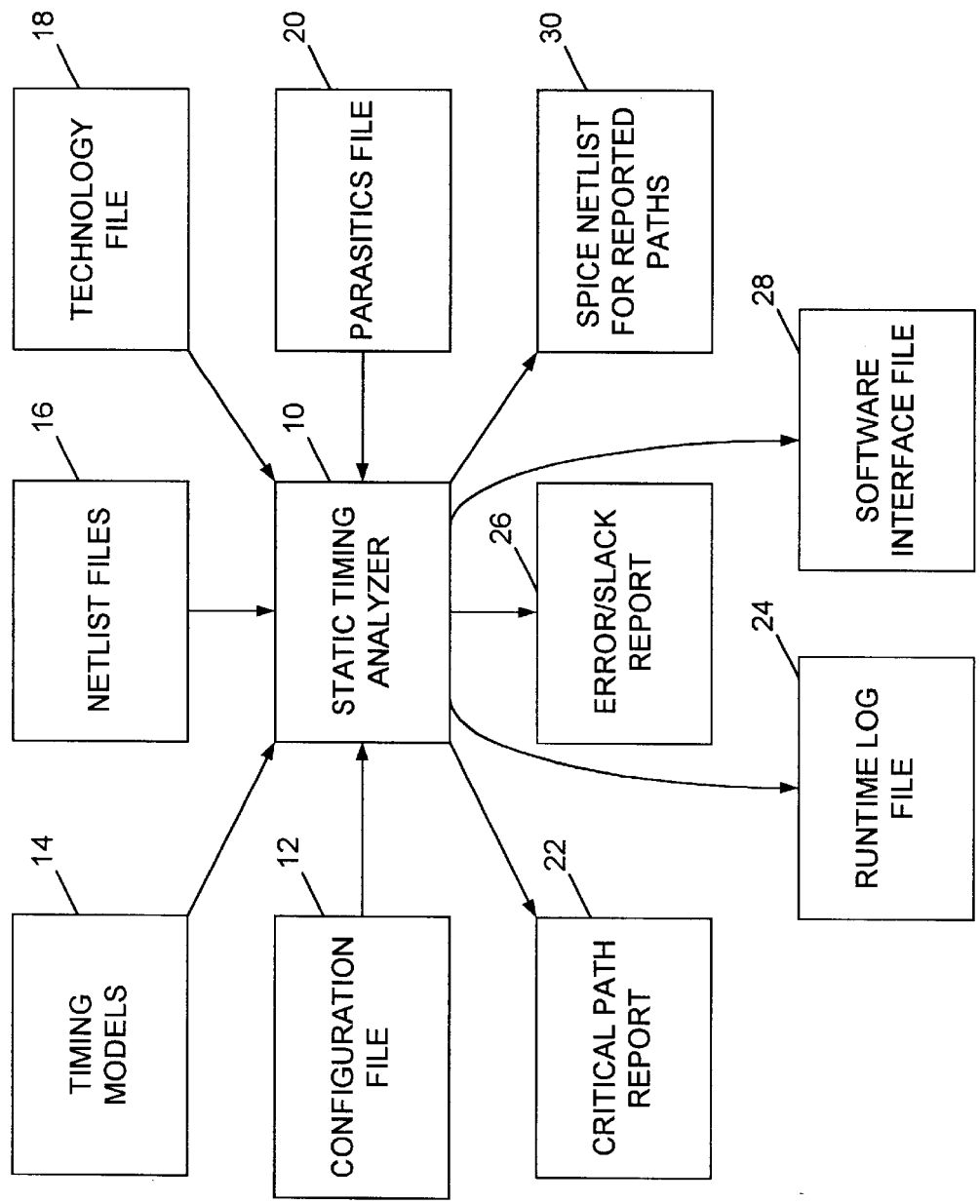
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
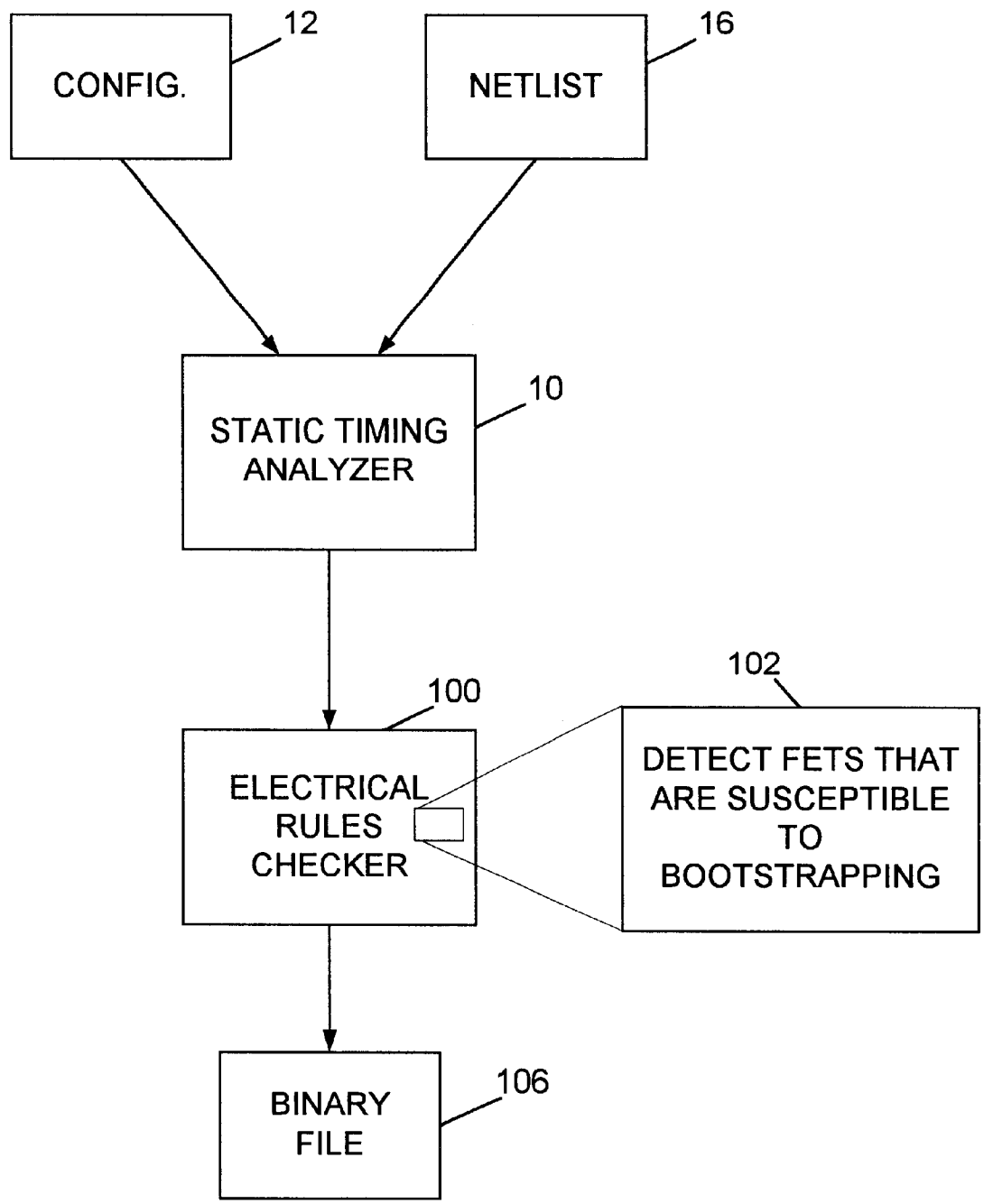
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, is those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program 100 operates to detect circuit configurations (e.g., FETs) that are susceptible to bootstrapping.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks.

However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate a database, as well as to detect FETs that are susceptible to bootstrapping 102, in accordance with the present invention.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
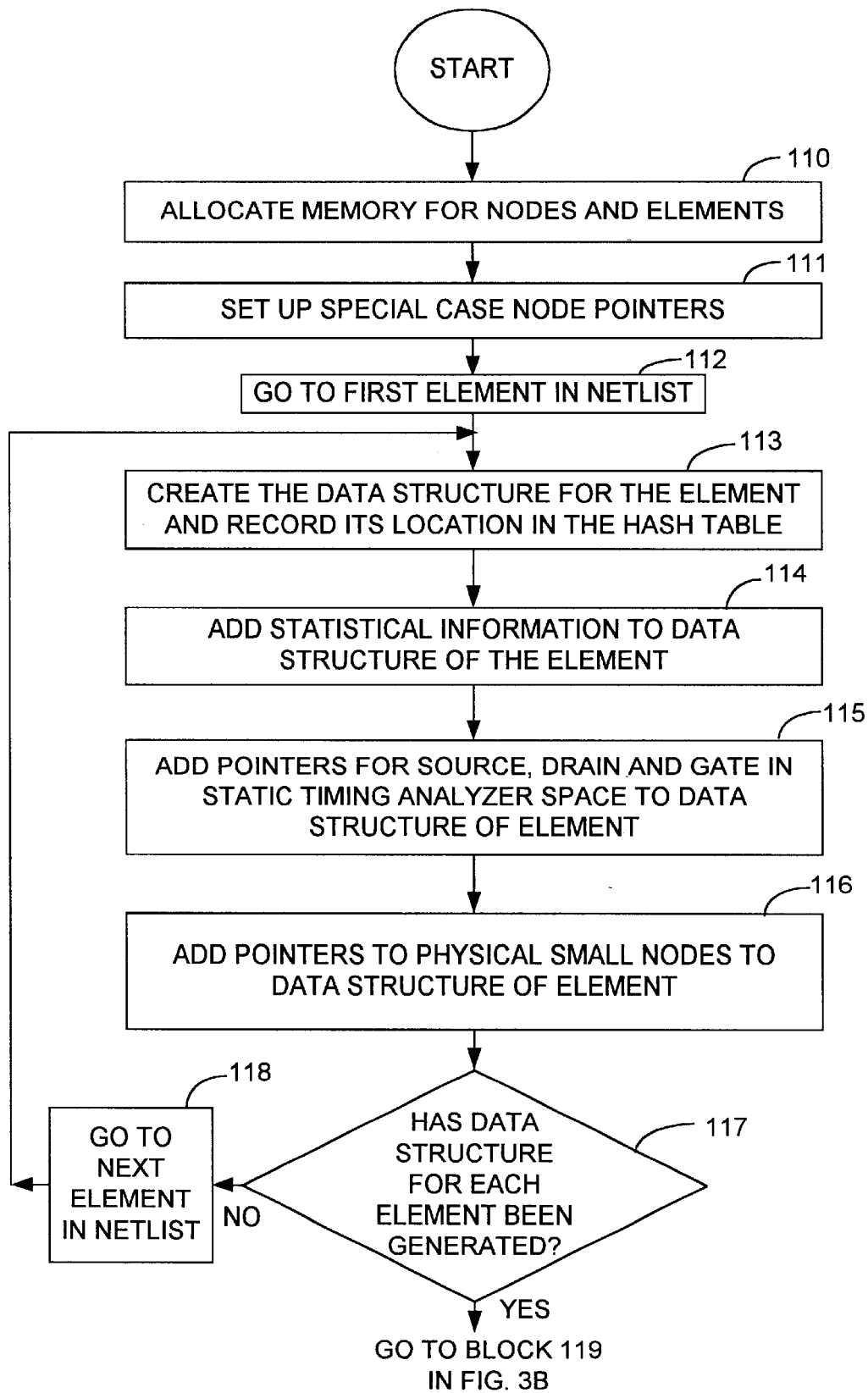
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
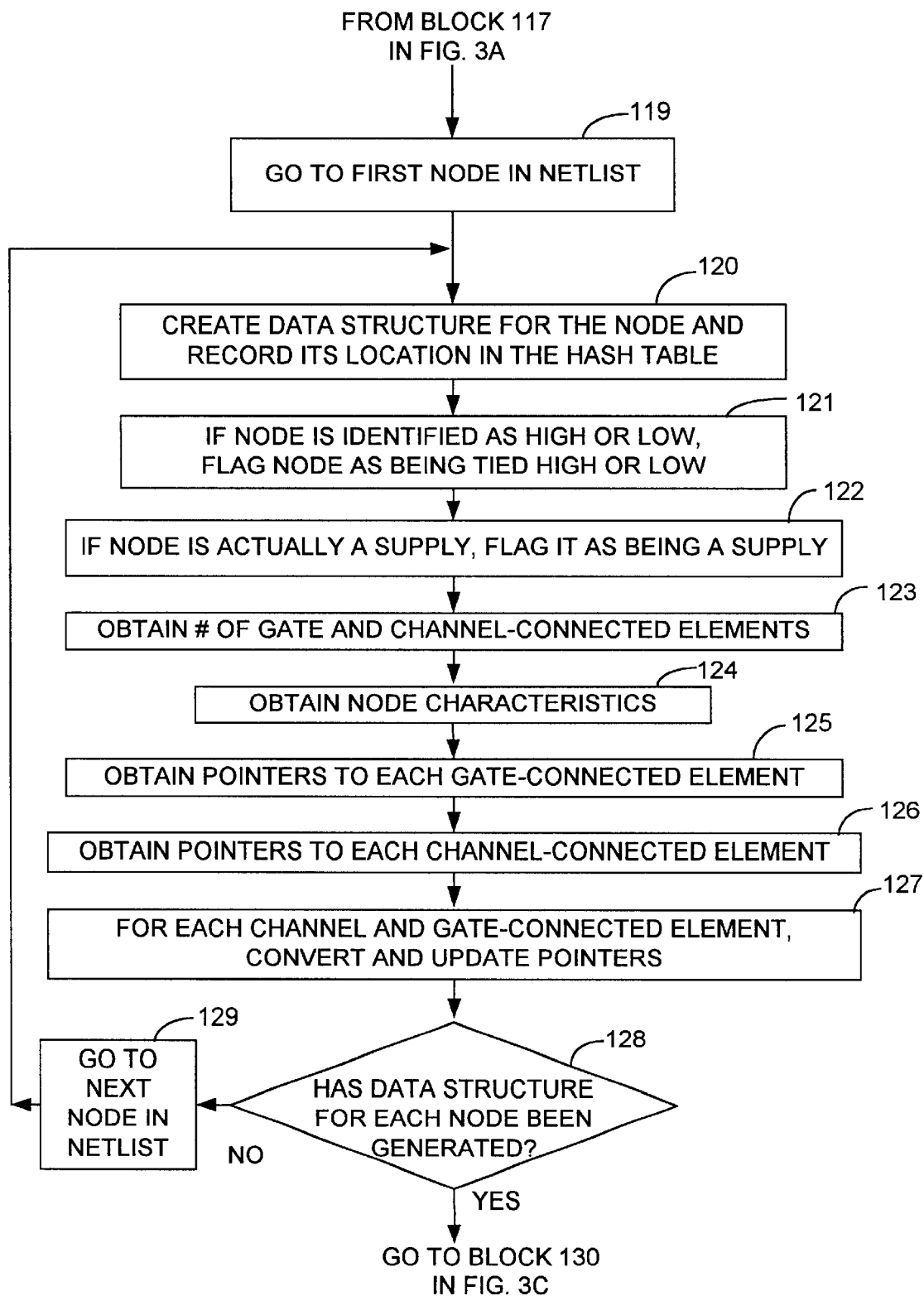

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
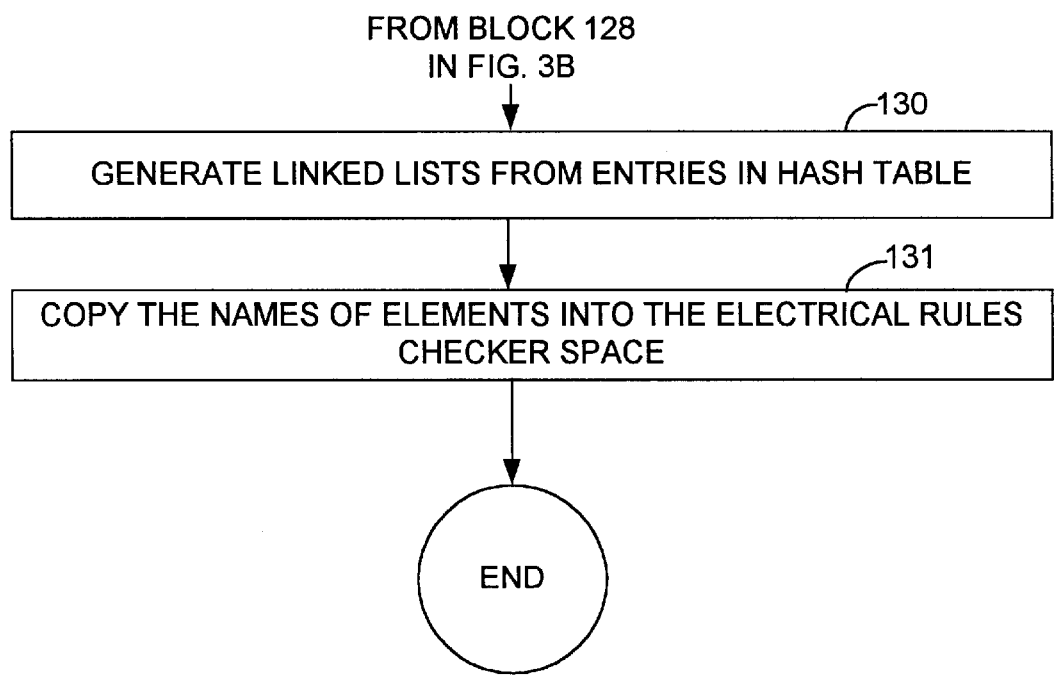

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. As previously mentioned, one such task, and the one performed by the present invention is the identification of FETs that are susceptible to bootstrapping.

As previously mentioned, the present invention is directed to a system and method for detecting FETs within a netlist that are susceptible to bootstrapping, also referred to sometimes as charge pumping. As is known, bootstrapping is a phenomenon wherein the voltage on a given node within a circuit exceeds the voltage of the supply for that circuit (sometimes referred to as a rail voltage). Although in some instances bootstrapping is desired, it is generally undesirable. Therefore, the present invention identifies all elements in a given circuit configuration that are susceptible to bootstrapping, and generates a warning for each such element. The circuit designer may use this information to change or correct such circuit configurations. Of course, in situations and which bootstrapping is actually desired, the circuit designer may choose to ignore the warnings generated by the present invention.

In accordance with the preferred embodiment of the present invention, there are principally two circuit configurations that are identified as being susceptible to bootstrapping. Once such circuit configuration is illustrated and FIG. 4A and the other such circuit configuration is illustrated in FIG. 4B. Generally, the circuit configurations identified by the preferred embodiment of the present invention are those where a gate node of a FET is driven by a FET of the same type (i.e., either p-type or n-type).

More particularly, the circuit configurations identified by the preferred embodiment as being susceptible to bootstrapping are configurations wherein a gate node of a FET is not driven by a FET of the opposite type. Therefore, the gate node of PFETs should be driven by (or connected to) a channel node of a NFET. Likewise, the gate node of NFETs should be driven by (or connected to) a channel node of a PFET. The reason for this will be more fully explained in connection with FIG. 6.

Figure 4A:
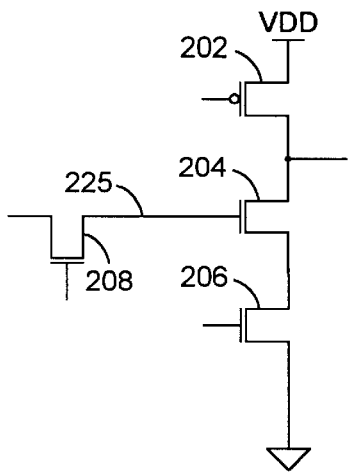
FIGS. 4A and 4B are circuit diagrams illustrating configurations having an element that is susceptible to bootstrapping.
Figure 4B:
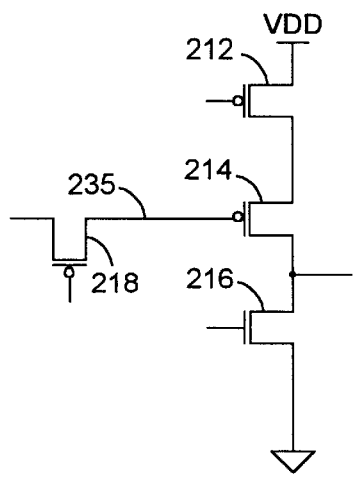

Referring first to FIG. 4A, a first configuration is illustrated having a series of FETs, including PFET 202, NFET 204, and NFET 206. NFET 208 is depicted in a pass gate configuration, having a channel node connected to the gate node 225 of NFET 204. Assuming that no PFETs are channel connected to node 225, the preferred embodiment of the present invention will identify NFET 204 as being susceptible to bootstrapping. As will be further described below, in order to be susceptible to bootstrapping, a NFET cannot be channel connected to ground. Likewise, a PFET cannot be channel connected to VDD.

Referring to FIG. 4B, a second circuit configuration is shown having a series of FETs, including PFET 212, PFET 214, and NFET 216. PFET 218 is depicted in a pass gate configuration, having a channel node connected to the gate node 235 of PFET 214. Assuming that no NFETs are channel connected to node 235, the preferred embodiment of the present invention will identify PEET 214 as being susceptible to bootstrapping, since its gate node 235 is not driven by a NFET.

Figure 5A:
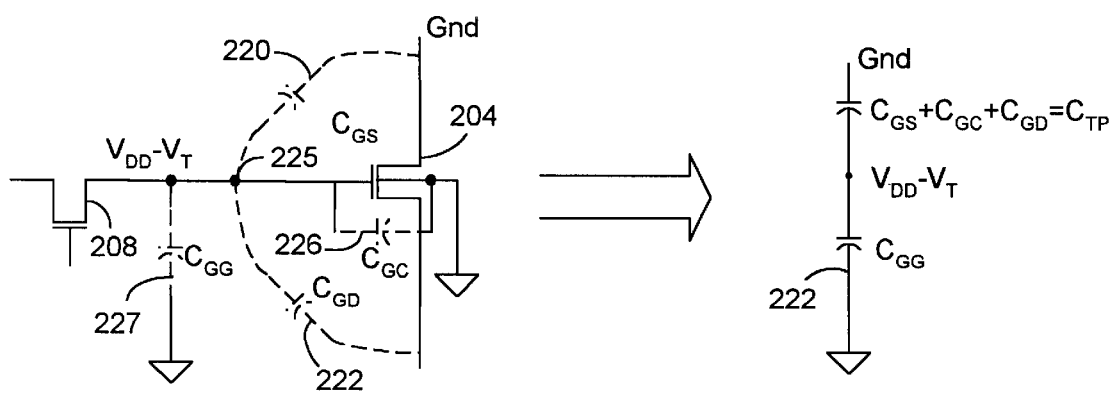
FIGS. 5A and 5B are circuit diagrams illustrating internal capacitances within a FET, to illustrate the bootstrapping phenomenon.
Figure 5B:
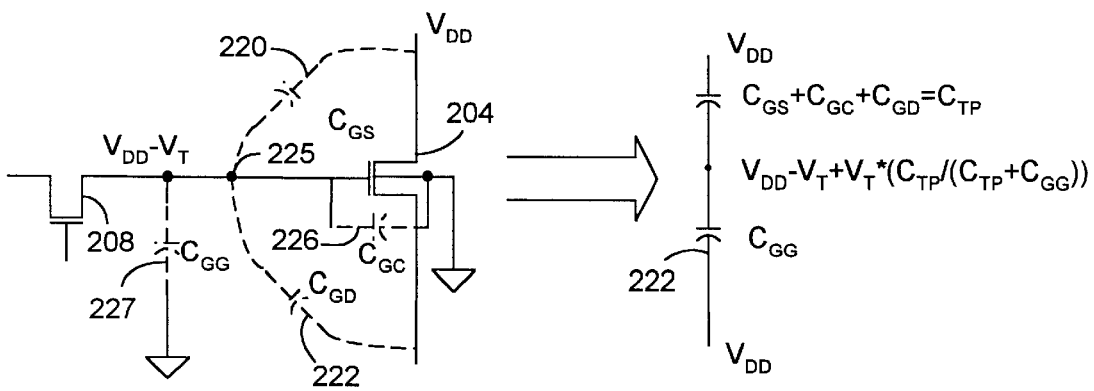

To more fully described the phenomenon of bootstrapping, reference is made to FIGS. 5A and 5B. It should be appreciated that, although the description provided herein has been somewhat simplified for purposes of illustration, it nevertheless provides an adequate description of the phenomenon of bootstrapping to allow one of ordinary skill to appreciate the operation of the present invention. Referring first to FIG. 5A, NFET 204 and 208 of FIG. 4A are illustrated. Also illustrated (in dash line) are the capacitances (inherent in the FET device) that exist between the gate node and the source node ($C_{GS}$) 220, the gate node and the drain node ($C_{GD}$) 222, the gate node and the channel (or substrate) ($C_{GC}$) 226, and the gate node to ground ($C_{GG}$) 227. For purposes of simplification, other capacitances have been ignored.

Specifically, the capacitance between the gate node 225 and the source node ($C_{GS}$) is illustrated as capacitor 220. The capacitance between the gate node 225 and the drain node ($C_{GD}$) is illustrated as capacitor 222. The capacitance between the gate node and the FET channel ($C_{GC}$) is illustrated as capacitor 226. And, the capacitance between the gate node and ground ($C_{GD}$) is illustrated as capacitor 227. When the FET 202 (of FIG. 4A) is turned off, and the voltage on the source node of NFET 204 is ground, and the pass gate 208 is turned on, then the voltage at the gate node 225 of FET 204 is approximately VDD-$V_T$, where $V_T$ is the threshold voltage of a semiconductor device. Therefore, a voltage of approximately VDD-$V_T$ is present across both capacitors 220 and 222. The right hand side of FIG. 5A diagramatically illustrates this.

When, however, PFET 202 turns on (as illustrated in FIG. 5B), then the voltage on the source node and drain nodes of NFET 204 both become approximately VDD (actually the voltage on the source node is closer to VDD-$V_T$, but VDD is a close approximation). The voltage on the gate node 225, however, spikes above VDD, due to the capacitance $C_{TF}$. As illustrated in the figure, the total FET capacitance $C_{TF}$ equals the sum of FET capacitances $C_{GS}$, $C_{GD}$, and $C_{GC}$. Again, this is a close approximation for purposes of illustration. Therefore, the voltage on node 225 will spike to level approximately equal to VDD-$V_{T+VDD*(CTF}/(C_{TF+CGG})$. Thus, the voltage at the gate node 225 of FET 204 will be proportional to the ratio of the capacitances $C_{TF}$ and $C_{GG}$. If the capacitances $C_{TF}$ and $C_{GG}$ are equal, then the voltage on gate node 225 will be approximately VDD-$V_T$+VDD/2. Since the threshold voltage (VT) is typically only a fraction of a volt, and VDD is approximately 3.3 V, it is readily seen that the voltage at the gate node 225 of NFET 204 will spike well above VDD.

Figure 6:
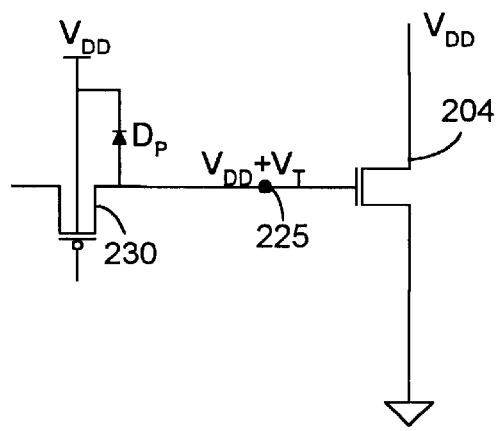
FIG. 6 is a circuit diagram illustrating a diode that is internal to a FET, which prevents the bootstrapping phenomenon when a PFET is configured to drive the gate node of a NFET.

If, however, the pass gate 208 was a PFET, then the bootstrapping phenomenon would not occur. The reason relates to a parasitic diode within a semiconductor structure of a FET. In this regard, reference is made to FIG. 6, illustrating such a diode ($D_p$). Specifically, FIG. 6 illustrates a PFET 230 that is configured to drive the gate node 225 of NFET 204. A parasitic diode exists in the semiconductor structure of the PFET 230, between the drain node and the substrate. As is known, the substrate of a PFET is connected to VDD, so the parasitic diode $D_p$ is effectively connected between the drain node of PFET 230 and VDD. Due to the existence of this diode, it is appreciated that the voltage on node 225 cannot rise above approximately VDD+$V_T$. Therefore, bootstrapping is avoided.

A similar configuration exists where a NFET drives the gate node of a PFET. Although not specifically illustrated, there is a parasitic diode between the drain node of a NFET and the substrate, and the substrate of a NFET is connected to ground. Therefore, when a NFET is configured to drive the gate node of a PFET, the voltage applied to the gate node of the PFET is prevented from dropping below ground.

Figure 7A:
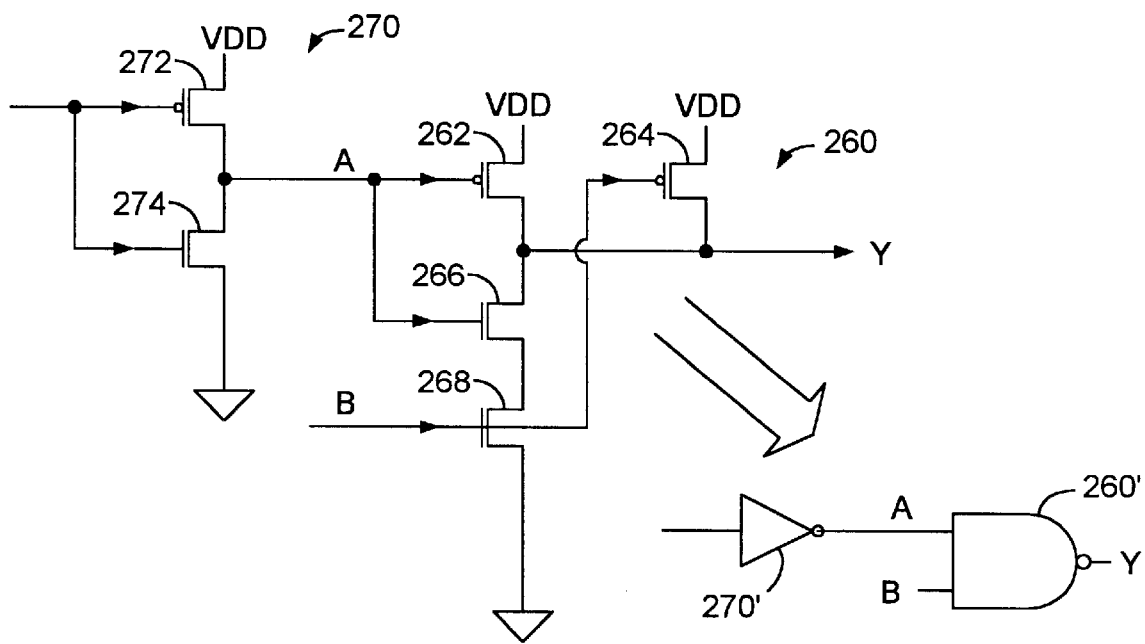
FIGS. 7A and 7B are circuit diagrams illustrating two similar circuit configurations, neither of which has any elements that are susceptible to bootstrapping.
Figure 7B:
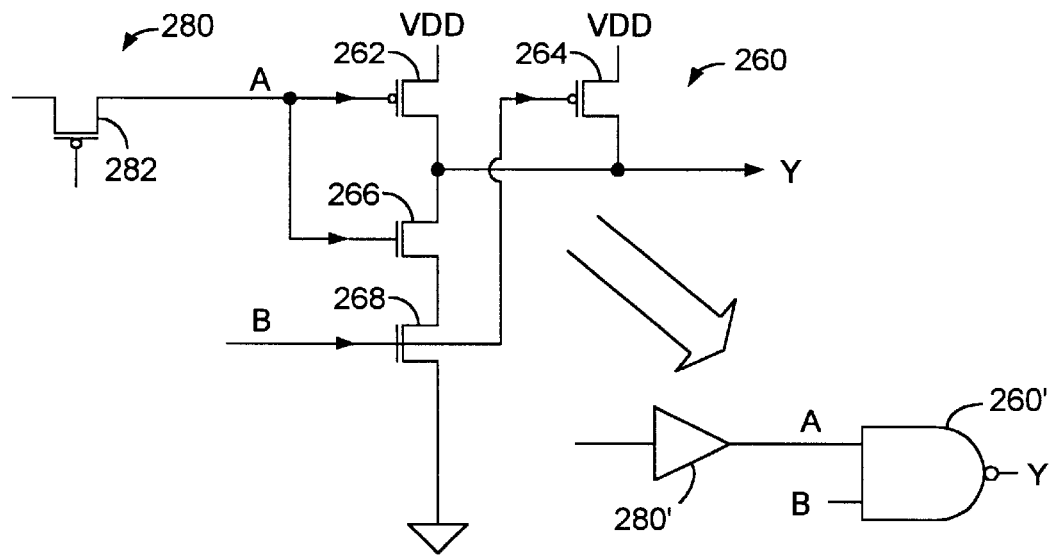
Figure 7C:
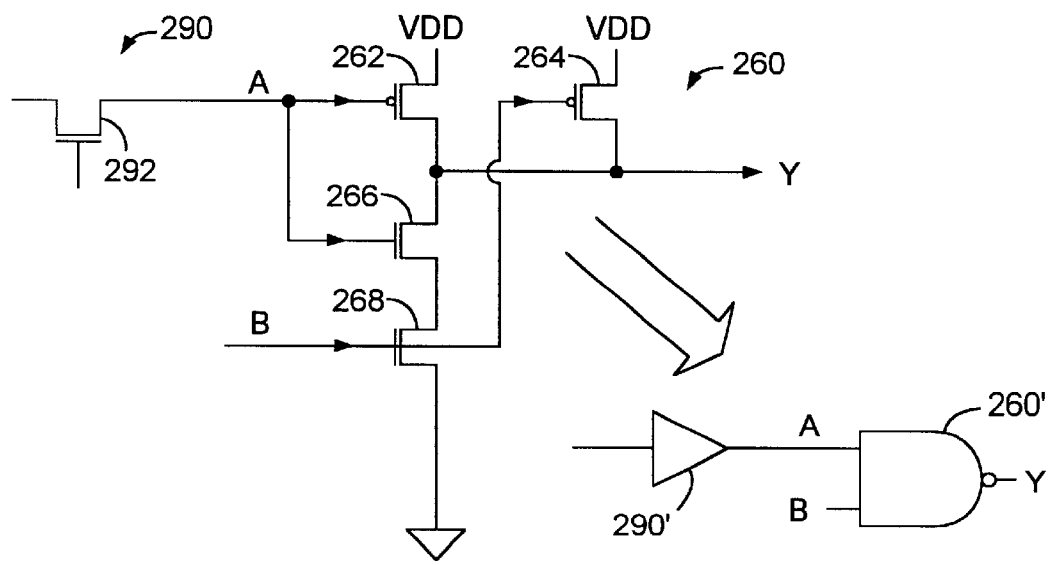
FIG. 7C is a circuit diagram similar to the diagram of FIG. 7B, but having one element that is identified by the present invention as being susceptible to bootstrapping.

Having described the phenomenon of bootstrapping, reference is now made to FIGS. 7A, 7B, and 7C, which illustrate various similar circuit configurations. Specifically, the circuit configurations of FIG. 7A and FIG. 7B are circuit configurations, which are not susceptible to bootstrapping. The circuit configuration of FIG. 7C, however, does contain an element that is susceptible to bootstrapping. Each of the three figures illustrates certain FETs that are configured to form a two input NAND gate, wherein one of the FETs is identified by the present invention as being susceptible to bootstrapping in one of the three configurations, but not in the other two configurations.

To more fully discuss, reference is made first to FIG. 7A, wherein a two input NAND gate 260 is illustrated. The exemplary construct of this NAND gate is formed by two PFETs 262 and 264 being connected in parallel, and two NFETs 266 and 268 being series connected. More specifically, a first input A for the two input NAND gate is directly connected to the gate nodes of PFET 262 and the NFET 266. The second input B of the two input NAND gate 260 is directly connected to the gate nodes of PFET 264 and NFET 268. Each of the PFET devices 262 and 264 are channel connected with the output node Y of the gate 260. In contrast, however the NFET devices that are channel connected to the output node are series connected. As illustrated by the pair of NFET devices illustrated in the figure, the series connection ensures that the NFET directly connected to the output node is not connected to Ground.

This same circuit configuration is shown in both FIGS. 7B and 7C. The difference between the three figures relates to the circuit component connected to the 15 input A of the NAND gate 260. In FIG. 7A, the input is an inverter 270, which comprises PFET 272 and NFET 274. In FIG. 7B, the input A is a buffer 280, which may comprise a simple pass gate 282. Likewise, in FIG. 7C, the input A is a buffer 290, which may comprise a simple pass gate 292. The pass gate 282 of FIG. 7B is an NFET, while the pass gate 292 of FIG. 7C is a PFET.

In accordance with the preferred embodiment of the present invention, the system will evaluate each FET within a netlist (or portion thereof). Therefore, each FET of FIG. 7A will be evaluated, one by one. PFETs 262, 264, and 272 will each be resolved to be nonproblematic (i.e., not susceptible to bootstrapping) due to the fact that each is channel connected to VDD. Likewise, NFET's 274 and 268 will each be resolved to be nonproblematic, due to the fact that each is channel connected to ground. Therefore, the only remaining FET is NFET 266. The preferred embodiment of the present invention will then evaluate the gate node (node A) of this FET to determine whether it is connected to a channel node of a FET of the opposite type (i.e., PFET). As can be readily verified by a cursory examination of the drawing, the system of the preferred embodiment will identify the gate node of NFET 266 as being connected to a channel node of PFET 272. Therefore, NFET 260 will not be identified as being susceptible to bootstrapping, even though it is connected to a channel node of another NFET (i.e., NFET 274).

FIG. 7B illustrates a similar, but slightly different configuration, wherein the inverter 270 is replaced by a pass gate 282. Under a similar evaluation, PFET 262 and 264 will be evaluated to be nonproblematic, since they are channel connected to VDD. Likewise, NFET 268 will be evaluated to be nonproblematic, since it is channel connected to ground. With regard to PFET 282, assuming that the circuit configuration illustrated in the drawing represents the entire circuit or circuit block under evaluation, the preferred embodiment of the present invention will disregard PFET 282, since its gate node will be viewed as an input to the circuit block (i.e., the gate node of PFET 282 does not have termination point within the circuit). Again, NFET 266 is the only element within the illustrated circuit that is potentially susceptible to bootstrapping. However, the preferred embodiment of the present invention will recognize that the gate node of NFET 266 is connected to a channel node of a PFET 282, and therefore conclude that NFET 266 is not susceptible to bootstrapping.

In FIG. 7C, however, PFET 282 has been replaced by a NFET 292. Under the evaluation of the preferred embodiment, the gate node of NFET 266 will be evaluated, and determined not to be driven by a channel node of a FET of the opposite type (i.e., is not connected to a PFET channel). Therefore, the present invention will "flag" NFET 266 as being susceptible to bootstrapping. It is readily observed that the configuration of FIG. 7C is similar to that illustrated in FIG. 4A Having described certain circuit configurations that are and are not identified by the present invention as being susceptible to bootstrapping, methods for carrying out the inventive concepts will now be discussed. In this regard, reference will now be made to reference is now made to FIG. 8, which is a flowchart illustrating the top-level functional operation of a system constructed in accordance with one aspect of the present invention. As previously mentioned, the system operates to evaluate a netlist file, or portion thereof, to detect all FETS that are susceptible to bootstrapping. Preferably, the system makes this evaluation by examining one FET at a time. Therefore, the system may begin by preceding to a first element in the netlist file (step 302). The system may then evaluate this element to determine whether the element is a FET (step 304). If not, the system may conclude that the element is not a FET that is susceptible to bootstrapping. The system may then make a determination as to whether there are more elements in the netlist to be evaluated (step 306). If not, then the routine ends. If, however, there are more elements in the netlist to be evaluated, then the system may proceed to the next element (step 308), then return to step 304 to continue with the evaluation as described above.

Figure 8:
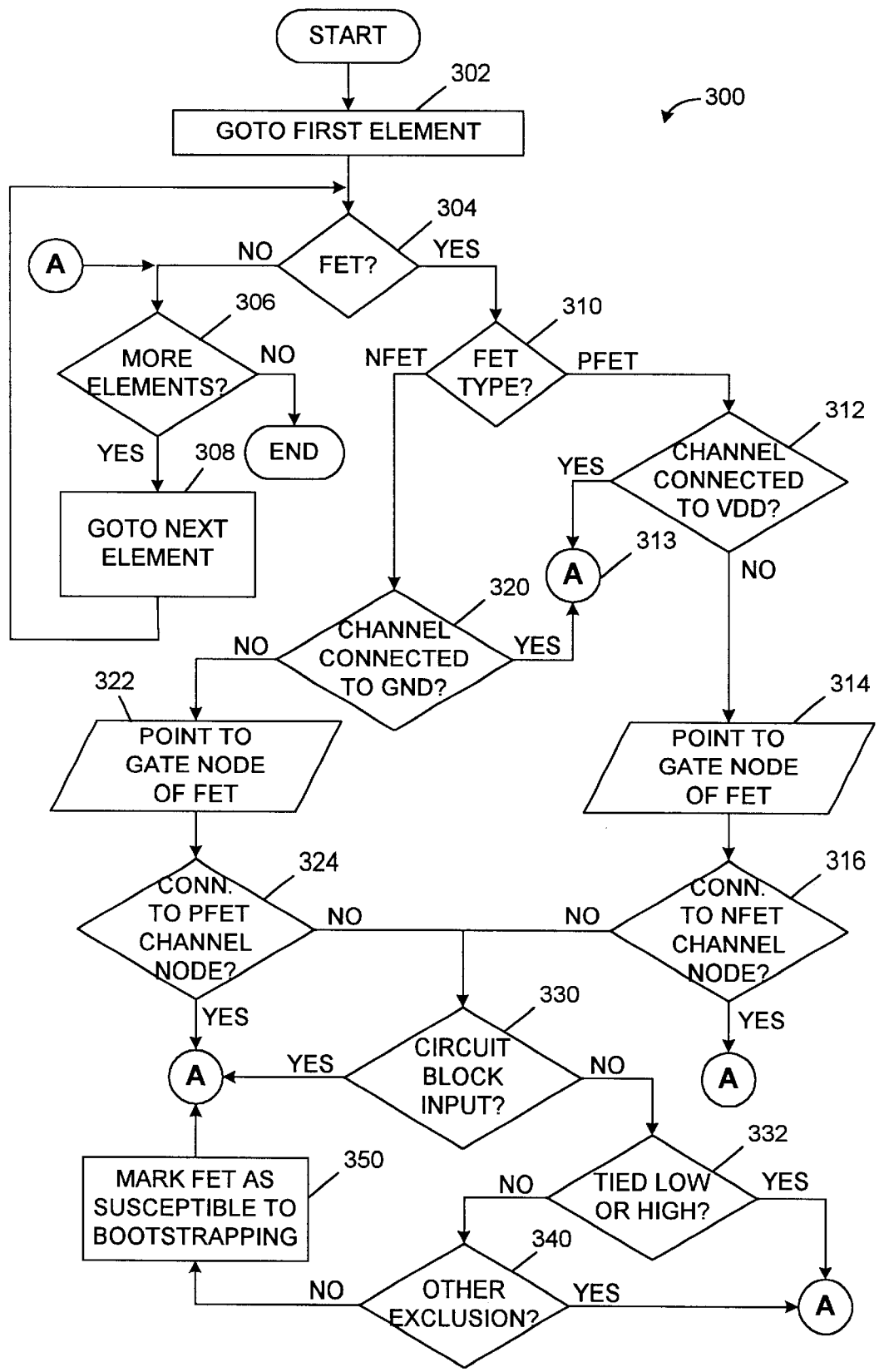
FIG. 8 is a flowchart illustrating the top level functional operation of a method, in accordance with one aspect of the present invention.

If the evaluation of step 304 resolves to "yes" (i.e., the current element is a FET), then the system may evaluate the FET to determine whether it is a p-type FET or and n-type FET (step 310). If the system determines that the FET is p-type FET, the then it may evaluate whether the FET is channel connected to the supply voltage, or VDD (step 312). If so, then the system may conclude that the current FET is not susceptible to bootstrapping, and may proceed to step 306 and continue from there in a manner described above. In this regard, the flowchart of FIG. 8 includes a circular item labeled "A" 313. This item is repeated in several locations of the flowchart and should be interpreted to represent a common node. Specifically, the node "A" is illustrated as having an output that leads into decision block 306. All other instances of the node 313 in FIG. 8 are inputs. Thus, for example, node 313 receives as an input the "yes" output of decision block 312. This represents the notion that the "yes" output of decision block 312 is directed to the input of decision block 306.

If decision block 312 determines that the current FET is not channel connected to VDD, then the system will evaluate the gate node of the current FET (block 314). Specifically, the system will evaluate the gate node of the current FET to determine whether a gate node of the current FET is connected to a NFET (n-type FET) channel node (step 316).

A similar, parallel path is reflected in block 320, 322, and 324. Specifically, if step 310 determines that the current FET is a NFET, then the system determines whether the current FET is channel connected to ground. If the system determines that the current FET is connected to ground, then it proceeds to step 322, where it evaluates the gate node of the current FET. Thereafter, the system determines whether the gate node of the current FET is connected to the channel node of a PFET (step 324).

In short, steps 310 through 324, as described above, make a determination of whether the gate node of the current FET is connected to a channel node of a FET of opposite type. Therefore, if the current FET is a NFET, then the system determines whether its gate node is connected to a channel node of a PFET. Similarly, if the current FET is a PFET, then the system determines whether its gate node is connected to a channel node of a NFET. If either step 316 or step 324 resolves to "yes", then the system proceeds to step 306 and continues from that point as described above.

If, however, step 316 (or step 324) resolves to "no", then the current FET may be susceptible to bootstrapping, and further evaluations are performed. For example, in one embodiment, the system determines whether the gate node of the current FET is a "block input" (step 330). As previously mentioned, the present invention operates to detect elements within a netlist that are susceptible to bootstrapping. In one embodiment, the invention may evaluate an entire netlist. In an alternative configuration, the system may be configured to evaluate only a designated portion of a netlist. Such a designated portion may also be referred to as a "block." If the system determines that the gate node of the current FET falls on the input boundary of a block, then it does not flag the current element as being susceptible to bootstrapping. The system may then return to step 306 and continue as described above.

If the gate node of the current FET, however, is determined not to be an input to a circuit block, then the system may evaluate the gate node of the current FET to determine whether it is either tied low or tied high (i.e., connected to ground or VDD) (step 332). If the gate node of the current FET is either tied low or high, then the system concludes that the current FET is not susceptible to bootstrapping, and may proceed to step 306 as described above. If, however, the gate node of the current FET is not tied low or high, then the system may assume that the current element is, in fact, susceptible to bootstrapping, and it may mark the current element accordingly (step 350).

As illustrated, additional, intervening evaluations may also be made to further hone or refine the determination of the present invention. Specifically, and as illustrated in FIG. 8, the system may perform evaluations to determine whether there are other exclusions (step 340). In this regard, an exclusion refers to a configuration that is identified that is not being susceptible to bootstrapping. Therefore, if other exclusions are identified, then the system proceeds from step 340 to step 306. If, however, other exclusions are not identified, then the system may mark the current element as being susceptible to bootstrapping (step 350).

Figure 9:
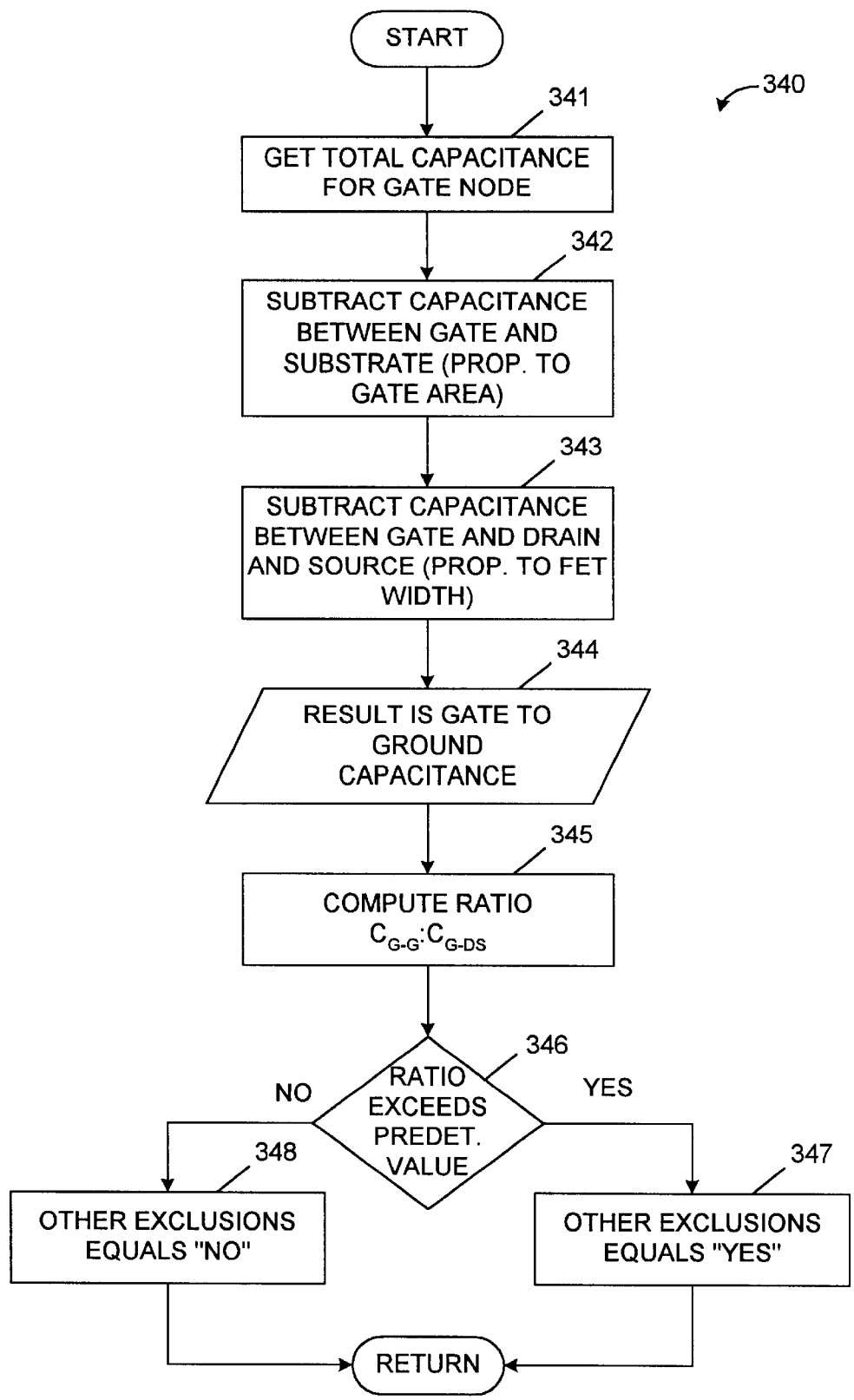
FIG. 9 is a flowchart illustrating the top level functional operation of a method for performing additional evaluations on an element, in accordance with one embodiment of the invention.

With regard to the "other exclusions", one such other exclusion may exist, for an element where the capacitance between the gate node of the current FET and ground is extremely large in comparison to the capacitance between the gate node and the source and drain nodes, and the channel. Therefore, one test which may be carried out within the realm of the "other exclusions" may be the determination of this capacitance ratio. Referring to FIG. 9, a flowchart is presented illustrating certain functional steps which may be carried out in one such evaluation. In one embodiment, the evaluation may begin by obtaining the total capacitance for a gate node of a current FET (step 341). Programs are known, and currently available, that perform this function and therefore, the function need not be described herein. As will be appreciated, the total capacitance of a given node is the collection of all capacitance is including the capacitance of the gate node to the substrate of the FET, the capacitance of all wires associated with or connected to the gate node, the capacitance between the gate node and the drain and source nodes, etc.

For purposes of carrying out the inventive aspects, many of these capacitances may be ignored, since they are extremely small in nature. A rough approximation may be made, however, by starting with the total capacitance of the gate node, subtracting the capacitance between the gate node and the substrate (step 342), then subtracting the capacitance between the gate node and the drain in source nodes (step 343). Again, the determination of these values may be computed, or may be obtained through extraction programs that are known in the art. Accordingly, these computations need not be described herein. As is known, the capacitance between the gate node and the substrate of a FET is proportional to the area of the gate. Similarly, the capacitance between the gate node of a FET and the drain in source nodes is proportional to the FET width.

Once these two intermediate capacitance values have been subtracted from the total capacitance, the remaining value is a close approximation of the capacitance between the gate node and ground (block 344). The system may then compute the ratio of the capacitance between the gate node and ground, to the capacitance between the gate node and the drain and source nodes (step 345). The system may then evaluate whether this computed ratio exceeds some predetermined value (step 346). In accordance with the inventive concepts, the predetermined value may be set by the program, or may be a value that a user of the program may freely define. In the preferred embodiment of the present invention, this predetermined value is effectively set to zero, because the preferred embodiment of the present invention does not undertake the evaluations illustrated in a flowchart of FIG. 9.

In keeping with the description of FIG. 9, if the computed ratio exceeds a predetermined value then the system may return a value of "yes" (step 347) for the "other exclusions" evaluation of step 340 (see FIG. 8). Otherwise, the system may return a value of "no" (step 348) for the "other exclusions" evaluation of step 340.

Figure 10:
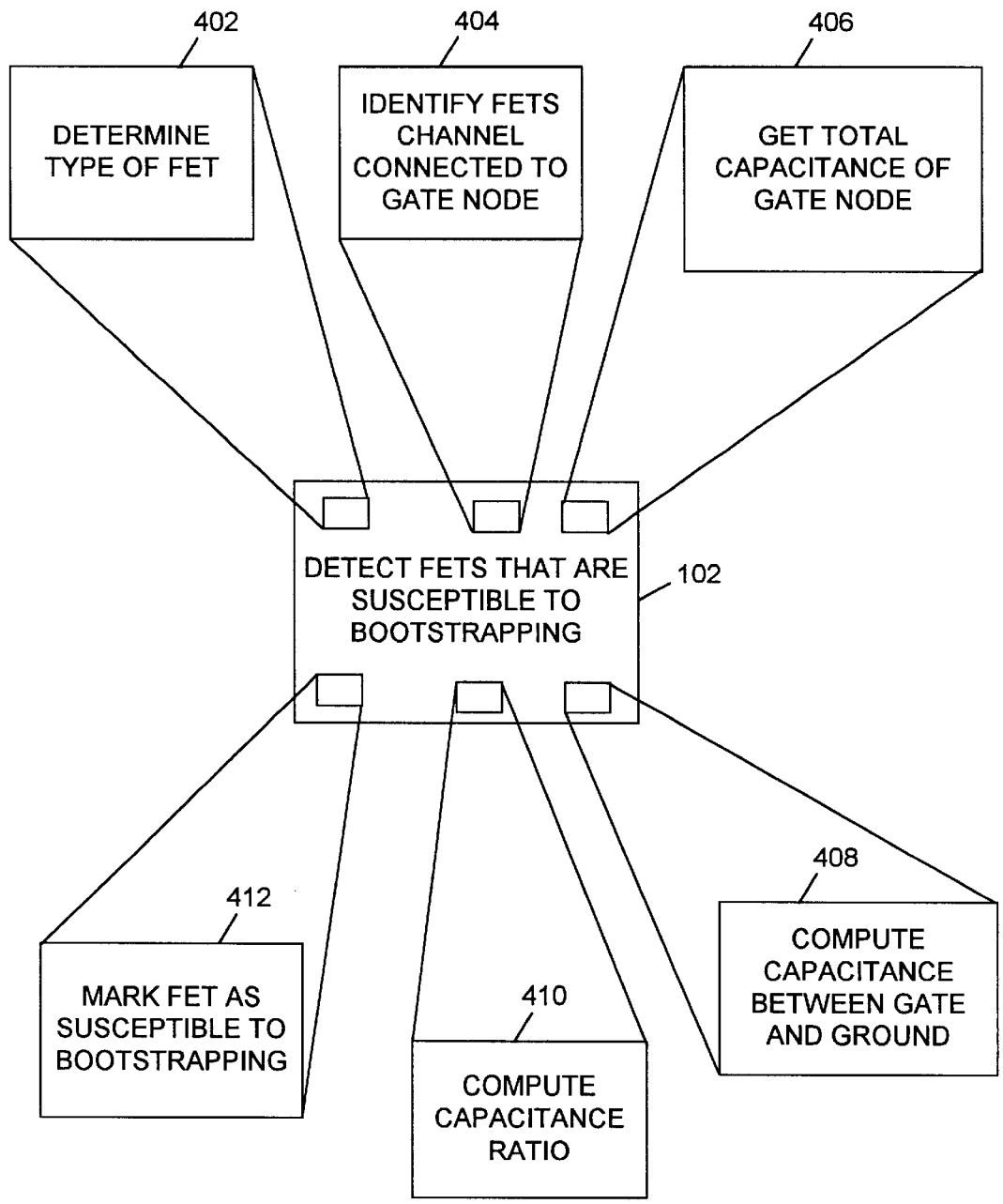
FIG. 10 is a block diagram illustrating certain fundamental code segments comprising a system constructed in accordance with the invention.

In keeping with the broader aspects of the invention, it will be appreciated that the steps illustrated in the flow charts of FIGS. 3A—3C, 8, and 9 are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to detect circuit configurations that are susceptible to bootstrapping. In the preferred embodiment, the system comprises software which may be provided on a computer readable storage medium in the form of code segments that are particularly configured to perform various functions. In this regard, reference is now made to FIG. 10, which illustrates certain functions which may be carried out by a system constructed in accordance with the teachings of the invention. For example, a first code segment 402 may be provided to determine the type of FET currently under evaluation. Another segment 404 may be provided to identify FETs that are channel connected to a gate node of a current FET.

Another segment 206 may be provided to obtain the total capacitance of a given node. Still another segment 208 may be provided to compute a capacitance that exists between a gate node of a FET and ground. Another segment may be provided to compute a capacitance ratio of the capacitance between the gate node and ground, and the capacitance between the gate node and the source and drain nodes. Yet another segment may be provided for marking a FET as being susceptible to bootstrapping and/or generating a warning message associated with a given FET. Consistent with the broader concepts of the invention, additional, fewer, or different segments may also be provided.

It should be appreciated that the flow charts of FIGS. 3A–3C, 8, and 9 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A–3C, 8, and 9. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for detecting n-type field effect transistors (NFETs) that are susceptible to bootstrapping:
   evaluating at least one NFET in a netlist;
   ensuring that the at least one NFET is not channel connected to ground; and
   ensuring that a gate node of the at least one NFET is connected to a channel node of a PFET.

2. The method as defined in claim 1 further including the step of ensuring that the gate node of the at least one NFET is not an input to a defined circuit block.

3. The method as defined in claim 1 further including the step of determining the capacitance between the gate node of the at least one NFET and ground.

4. The method as defined in claim 3, wherein the step of determining the capacitance between the gate node of the at least one NFET and ground further includes determining a total capacitance of the gate node of the at least one NFET and subtracting from the total capacitance a capacitance between the gate node and a substrate of the at least one NFET, and also subtracting from the total capacitance a capacitance between the gate node and source and drain nodes of the at least one NFET.

5. The method as defined in claim 4 wherein the step subtracting from the total capacitance the capacitance between the gate node and a substrate further includes determining the capacitance between the gate node and the substrate as a function of an area of the gate node.

6. The method as defined in claim 4 wherein the step subtracting from the total capacitance the capacitance between the gate node and the source and drain nodes further includes determining the capacitance between the gate node and the source and drain nodes as function of a width of the NFET.

7. The method as defined in claim 3 further including the step of determining the capacitance between the gate node of the at least one NFET and a drain and source of the at least one NFET.

8. The method as defined in claim 7 further including the steps of computing a ratio of the capacitance between the gate node of the at least one NFET and ground and the capacitance between the gate node of the at least one NFET and the source and drain nodes of the at least one NFET, and ensuring that the ratio is large.

9. A method for detecting p-type field effect transistors (PFETs) that are susceptible to bootstrapping:
   evaluating at least one PFET in a netlist;
   ensuring that the at least one PFET is not channel connected to VDD; and
   ensuring that a gate node of the at least one PFET is connected to a channel node of a NFET.

10. The method as defined in claim 9 further including the step of ensuring that the gate node of the at least one PFET is not an input to a defined circuit block.

11. The method as defined in claim 9 further including the step of determining the capacitance between the gate node of the at least one PFET and ground.

12. The method as defined in claim 11, wherein the step of determining the capacitance between the gate node of the at least one PFET and ground further includes determining a total capacitance of the gate node of the at least one PFET and subtracting from the total capacitance a capacitance between the gate node and a substrate of the at least one PFET, and also subtracting from the total capacitance a capacitance between the gate node and source and drain nodes.

13. The method as defined in claim 12 wherein the step subtracting from the total capacitance the capacitance between the gate node and a substrate further includes determining the capacitance between the gate node and the substrate as a function of an area of the gate node.

14. The method as defined in claim 12 wherein the step subtracting from the total capacitance the capacitance between the gate node and the source and drain nodes further includes determining the capacitance between the gate node and the source and drain nodes as function of a width of the NPET.

15. The method as defined in claim 11 further including the step of determining the capacitance between the gate node of the at least one PFET and a drain and source of the at least one PFET.

16. The method as defined in claim 15 further including the steps of computing a ratio of the capacitance between the gate node of the at least one PFET and ground and the capacitance between the gate node of the at least one PFET and the source and drain nodes of the at least one PFET, and ensuring that the ratio is large.

17. A system for detecting field effect transistors (FETs) that are susceptible to bootstrapping:
   means for evaluating at least one FET in a netlist;
   means for ensuring that the at least one FET is not channel connected to VDD, if the FET is a PFET and for ensuring that the at least one FET is not channel connected to ground, if the FET is a NFET; and means for ensuring that a gate node of the at least one FET is connected to a channel node of a FET of opposite type.

18. The system as defined in claim 17 wherein each of the means elements is implemented as a segment of program code in a computer readable medium, for execution by a processor.

19. The system as defined in claim 17 further including means for evaluating the capacitance on the gate node.

20. The system as defined in claim 17 further including means for computing a ratio of the capacitance between the gate node of the at least one FET and ground and the capacitance between the gate node of the at least one FET and the source and drain nodes of the at least one FET, and ensuring that the ratio is large.

* * * * *